(12) United States Patent
Terauchi

(10) Patent No.: US 7,532,013 B2
(45) Date of Patent: May 12, 2009

(54) SEMICONDUCTOR INTEGRATED CIRCUIT AND MEASURING METHOD OF TERMINATOR RESISTOR IN THE SEMICONDUCTOR INTEGRATED CIRCUIT

(75) Inventor: Ryota Terauchi, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 11/951,260

(22) Filed: Dec. 5, 2007

(65) Prior Publication Data

US 2008/0136441 A1    Jun. 12, 2008

(30) Foreign Application Priority Data

Dec. 8, 2006    (JP) .............................. 2006-332363

(51) Int. Cl.
*G01R 31/02* (2006.01)
(52) U.S. Cl. .......................... 324/549; 324/691; 326/30
(58) Field of Classification Search ................. 324/549, 324/691, 765; 326/30, 82
See application file for complete search history.

(56) References Cited

U.S. PATENT DOCUMENTS

| 6,262,434 B1* | 7/2001 | Kalb ........................... 257/48 |
| 6,397,361 B1 | 5/2002 | Saitoh |
| 6,885,213 B2 | 4/2005 | Sunter |
| 6,977,510 B1 | 12/2005 | Arigliano |
| 2008/0004819 A1* | 1/2008 | Namba et al. .................. 702/65 |

FOREIGN PATENT DOCUMENTS

JP    2004-198168    7/2004

* cited by examiner

*Primary Examiner*—Don P Le
(74) *Attorney, Agent, or Firm*—Amin, Turocy & Calvin, LLP

(57) ABSTRACT

A semiconductor integrated circuit for receiving a signal having been propagated through a transmission line, has a control circuit that controls on/off of a first to fourth switching circuits, wherein the control circuit turns off the first switching circuit and the second switching circuit and turns on the third switching circuit and the fourth switching circuit in a test operation mode for measuring a resistance value of the terminator resistor, and the control circuit turns on the first switching circuit and the second switching circuit and turns off the third switching circuit and the fourth switching circuit in a normal operation mode for a normal operation.

10 Claims, 4 Drawing Sheets

SEMICONDUCTOR INTEGRATED CIRCUIT AND MEASURING METHOD OF TERMINATOR RESISTOR IN THE SEMICONDUCTOR INTEGRATED CIRCUIT

CROSS-REFERENCE TO RELATED APPLICATION

This application is based upon and claims the benefit of priority from the prior Japanese Patent Application No. 2006-332363, filed on Dec. 8, 2006, the entire contents of which are incorporated herein by reference.

BACKGROUND OF THE INVENTION

1. Field of the Invention

The present invention relates to a semiconductor integrated circuit in which the resistance value of an internal terminator resistor can be measured.

2. Background Art

In recent years, as means for transmitting a number of signals, low voltage differential signaling (LVDS) interface circuits have been used which are semiconductor integrated circuits using current as signal transmitting means.

Such a LVDS circuit has a 100 Ω terminator resistor connected immediately before the input of a receiver circuit. The terminator resistor may be included in the semiconductor integrated circuit to reduce the number of components of the product. The terminator resistor has a resistance value defined by the predetermined specifications of the product. In the specifications, the resistance value is set at, e.g., 100 Ω±15 Ω.

In order to secure the resistance value in the product, it is necessary to measure a resistance value on a wafer in a die sorter test and measure a resistance value after the assembled product is put into a socket in the final test.

In a conventional method of measuring a resistance, both ends of a resistor are connected to a measuring device, a voltage is applied to the resistor, and a resistance is determined based on a value of passing current. In this measuring method, since a resistance is measured on two terminals, a measurement error may occur when there is a resistance between the measuring device and the resistor (for example, see Japanese Patent Laid-Open No. 2004-198168).

For example, a measurement on a wafer may cause a contact resistance between a pad and the probe of a measuring device and a measurement with a socket may cause a contact resistance between an assembled product and a pin of the socket. Therefore, even when the product is manufactured with a resistance value conforming to the specifications, the yields may decrease due to the problems on tests.

As a measuring method unaffected by a contact resistance, a method of measuring a resistance value on four terminals is available. In this measuring method on four terminals, a current is applied across first and second terminals connected to both ends of a measured resistor, and a potential difference between third and fourth terminals separately connected to both ends of the measured resistor is divided by the applied current. Thus the resistance value of the measured resistor is determined.

In the four-terminal method, current does not pass between the third and fourth terminals. Thus even when there is a contact resistance between the third and fourth terminals and the measured resistor, the resistance value of the measured resistor can be determined without being affected by the contact resistance.

However, the application of the four-terminal method in the aforementioned LVDS circuits requires two input/output terminals for testing in addition to two input/output terminals connected to a terminator resistor. Thus it is not possible to reduce the number of input/output terminals.

SUMMARY OF THE INVENTION

According to one aspect of the present invention, there is provided: a semiconductor integrated circuit for receiving a signal having been propagated through a transmission line, comprising:

a logic circuit that performs a logical operation;

a first input/output terminal connected to the logic circuit;

a second input/output terminal connected to the logic circuit;

a differential input receiver circuit having an output connected to the logic circuit, receiving the signal having been propagated through the transmission line, and outputting the signal to the logic circuit;

a terminator resistor connected between a non-inverting input terminal and an inverting input terminal of the differential input receiver circuit to achieve impedance matching with the transmission line;

a third input/output terminal connected to the non-inverting input terminal of the differential input receiver circuit to receive the signal;

a fourth input/output terminal connected to the inverting input terminal of the differential input receiver circuit to receive the signal;

a first switching circuit connected between the logic circuit and the first input/output terminal;

a second switching circuit connected between the logic circuit and the second input/output terminal;

a third switching circuit connected between the first input/output terminal and the third input/output terminal;

a fourth switching circuit connected between the second input/output terminal and the fourth input/output terminal; and a control circuit that controls on/off of the first to fourth switching circuits, wherein the control circuit turns off the first switching circuit and the second switching circuit and turns on the third switching circuit and the fourth switching circuit in a test operation mode for measuring a resistance value of the terminator resistor, and the control circuit turns on the first switching circuit and the second switching circuit and turns off the third switching circuit and the fourth switching circuit in a normal operation mode for a normal operation.

According to the other aspect of the present invention, there is provided: a semiconductor device, comprising: a semiconductor integrated circuit for transmitting a signal to be propagated through a transmission line, comprising:

a logic circuit that performs a logical operation;

a first input/output terminal connected to the logic circuit;

a second input/output terminal connected to the logic circuit;

a differential output driver circuit having an input connected to the logic circuit, and transmitting, to the transmission line, a signal having been outputted from the logic circuit;

a terminator resistor connected between a non-inverting output terminal and an inverting output terminal of the differential output driver circuit to achieve impedance matching with the transmission line;

a third input/output terminal connected to the non-inverting output terminal of the differential output driver circuit to transmit the signal;

a fourth input/output terminal connected to the inverting output terminal of the differential output driver circuit to transmit the signal;

a first switching circuit connected between the logic circuit and the first input/output terminal;

a second switching circuit connected between the logic circuit and the second input/output terminal;

a third switching circuit connected between the first input/output terminal and the third input/output terminal;

a fourth switching circuit connected between the second input/output terminal and the fourth input/output terminal; and a control circuit that controls on/off of the first to fourth switching circuits, wherein the control circuit turns off the first switching circuit and the second switching circuit and turns on the third switching circuit and the fourth switching circuit in a test operation mode for measuring a resistance value of the terminator resistor, and the control circuit turns on the first switching circuit and the second switching circuit and turns off the third switching circuit and the fourth switching circuit in a normal operation mode for a normal operation.

According to further aspect of the present invention, there is provided: a semiconductor device, comprising: a semiconductor integrated circuit for receiving a signal having been propagated through a transmission line, comprising:

a first input/output terminal connected to a first potential;

a second input/output terminal connected to a second potential;

a logic circuit that performs a logical operation;

a differential input receiver circuit having an output connected to the logic circuit, receiving the signal having been propagated through the transmission line, and outputting the signal to the logic circuit;

a terminator resistor connected between a non-inverting input terminal and an inverting input terminal of the differential input receiver circuit to achieve impedance matching with the transmission line;

a third input/output terminal connected to the non-inverting input terminal of the differential input receiver circuit to receive the signal;

a fourth input/output terminal connected to the inverting input terminal of the differential input receiver circuit to receive the signal;

a first switching circuit connected between the first input/output terminal and the third input/output terminal;

a second switching circuit connected between the second input/output terminal and the fourth input/output terminal; and a control circuit that controls on/off of the first and second switching circuits, wherein the control circuit turns on the first switching circuit and the second switching circuit in a test operation mode for measuring a resistance value of the terminator resistor, and the control circuit turns off the first switching circuit and the second switching circuit in a normal operation mode for a normal operation.

According to still further aspect of the present invention, there is provided: a semiconductor device, comprising: a semiconductor integrated circuit for transmitting a signal to be propagated through a transmission line, comprising:

a logic circuit that performs a logical operation;

a first input/output terminal connected to a first potential;

a second input/output terminal connected to a second potential;

a differential output driver circuit having an input connected to the logic circuit, and transmitting, to the transmission line, a signal having been outputted from the logic circuit;

a terminator resistor connected between a non-inverting output terminal and an inverting output terminal of the differential output driver circuit to achieve impedance matching with the transmission line;

a third input/output terminal connected to the non-inverting output terminal of the differential output driver circuit to transmit the signal;

a fourth input/output terminal connected to the inverting output terminal of the differential output driver circuit to transmit the signal;

a first switching circuit connected between the first input/output terminal and the third input/output terminal;

a second switching circuit connected between the second input/output terminal and the fourth input/output terminal; and a control circuit that controls on/off of the first and second switching circuits, wherein the control circuit turns on the first switching circuit and the second switching circuit in a test operation mode for measuring a resistance value of the terminator resistor, and the control circuit turns off the first switching circuit and the second switching circuit in a normal operation mode for a normal operation.

DETAILED DESCRIPTION

Exemplary embodiments of the present invention will now be described in accordance with the accompanying drawings.

First Embodiment

Figure 1:
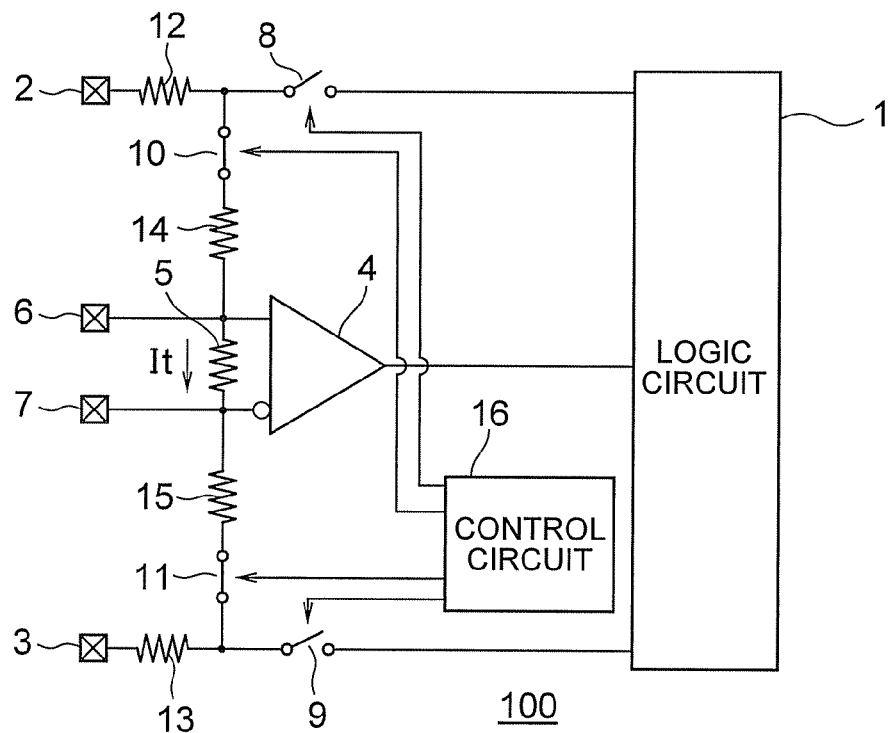
FIG. 1 shows the configuration of the main part of a semiconductor integrated circuit 100 according to a first embodiment.
Figure 2:
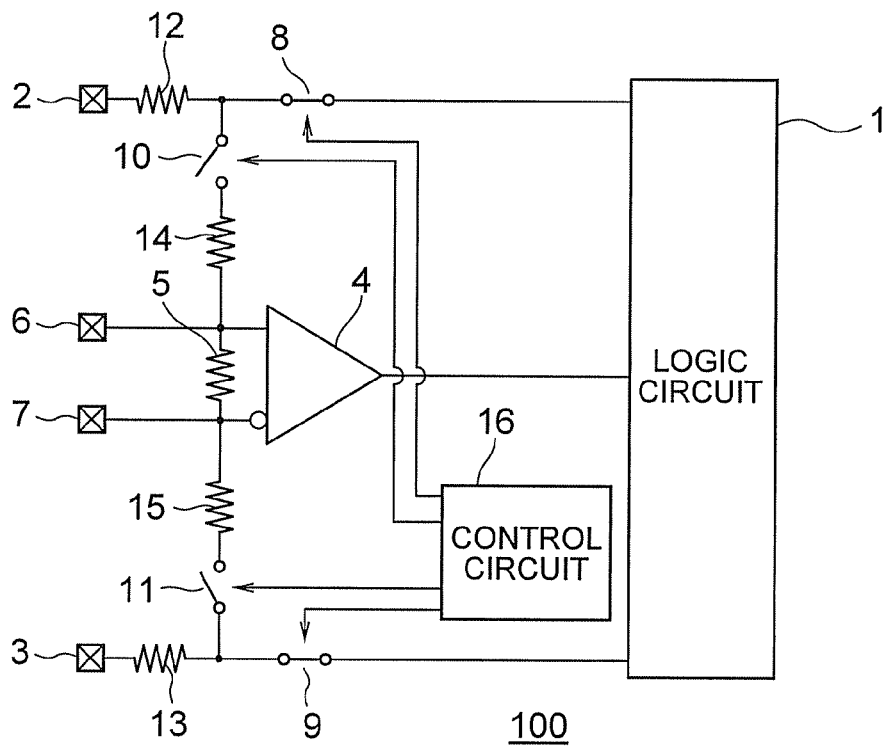
FIG. 2 shows the configuration of the main part of a semiconductor integrated circuit 100 according to the first embodiment.

FIGS. 1 and 2 show the configuration of the main part of a semiconductor integrated circuit 100 according to a first embodiment which is an aspect of the present invention. FIG. 1 shows the semiconductor integrated circuit 100 placed in a test operation mode which will be described later. FIG. 2 shows the semiconductor integrated circuit 100 placed in a normal operation mode which will be described later.

As shown in FIGS. 1 and 2, the semiconductor integrated circuit 100 for receiving a signal having been transmitted through a transmission line (not shown) includes a logic circuit 1 for performing logical operations, a first input/output terminal 2 connected to the logic circuit 1, and a second input/output terminal 3 connected to the logic circuit 1.

In the normal operation mode for normal operations, the first and second input/output terminals 2 and 3 are used to input desired signals to the logic circuit 1 from other circuits (not shown) and allow the other circuits to receive signals from the logic circuit 1.

The semiconductor integrated circuit 100 further includes a differential input receiver circuit 4 which has an output connected to the logic circuit 1, receives a signal having been transmitted through the transmission line, and outputs the signal to the logic circuit 1, and a terminator resistor 5 connected between the non-inverting input terminal and the inverting input terminal of the differential input receiver circuit 4 to achieve impedance matching with the transmission line.

The terminator resistor 5 has a resistance value defined by the predetermined specifications of the product. In the specifications, the resistance value is set at, e.g., 100 Ω±15 Ω.

The semiconductor integrated circuit 100 further includes a third input/output terminal 6 connected to the non-inverting input terminal of the differential input receiver circuit 4 to receive a signal having been transmitted through the transmission line, and a fourth input/output terminal 7 connected to the inverting terminal of the differential input receiver circuit 4 to receive a signal having been transmitted through the transmission line.

The semiconductor integrated circuit 100 further includes a first switching circuit 8 connected between the logic circuit 1 and the first input/output terminal 2, a second switching circuit 9 connected between the logic circuit 1 and the second input/output terminal 3, a third switching circuit 10 connected between the first input/output terminal 1 and the third input/output terminal 6, and a fourth switching circuit 11 connected between the second input/output terminal 3 and the fourth input/output terminal 7.

Since a test current "It" passes through the third switching circuit 10 and the fourth switching circuit 11, it is desirable that the third switching circuit 10 and the fourth switching circuit 11 be analog switching circuits having low on resistances. In the present embodiment, the first to fourth switching circuits 8, 9, 10 and 11 are each made up of a transistor such as a MOS transistor and a bipolar transistor which are controlled to be turned on/off in response to an input signal.

The semiconductor integrated circuit 100 further includes a first resistor 12 connected between the first switching circuit 8 and third switching circuit 10 and the first input/output terminal 2, a second resistor 13 connected between the second switching circuit 9 and fourth switching circuit 11 and the second input/output terminal 3, a third resistor 14 connected between the third switching circuit 10 and the third input/output terminal 6, and a fourth resistor 15 connected between the fourth switching circuit 11 and the fourth input/output terminal 7.

As described above, the first to fourth switching circuits 8, 9, 10 and 11 are each made up of a transistor. The first to fourth switching circuits 8, 9, 10 and 11 are, however, connected to the first to fourth input/output terminals 2, 3, 6 and 7 via the first to fourth resistors 12, 13, 14 and 15. Thus it is possible to prevent electrostatic discharge (ESD) and the like of the transistors.

The semiconductor integrated circuit 100 further includes a control circuit 16 for controlling the on/off of the first to fourth switching circuits 8, 9, 10 and 11 by outputting signals.

The operations of the semiconductor integrated circuit 100 configured thus (a measuring method of the terminator resistor 5 in the semiconductor integrated circuit 100) will now be described.

In the test operation mode for measuring the resistance value of the terminator resistor 5, as shown in FIG. 1, the control circuit 16 turns off the first switching circuit 8 and the second switching circuit 9 and turns on the third switching circuit 10 and the fourth switching circuit 11.

At this moment, a path for passing the test current "It" through the terminator resistor 5 is formed between the first input/output terminal 2 and the second input/output terminal 3. Further, a potential difference across the terminator resistor 5 can be measured using the third input/output terminal 6 and the fourth input/output terminal 7. Thus a four-terminal measurement can be performed on the terminator resistor 5.

In other words, in the test operation mode, the test current "It" is passed between the first input/output terminal 2 and the second input/output terminal 3, so that the test current "It" is applied to the terminator resistor 5. Moreover, a potential difference "ΔV" between the third input/output terminal 6 and the fourth input/output terminal 7 is measured as expressed in equation (1) where "V1" represents a potential measured on the third input/output terminal 6 and "V2" represents a potential measured on the fourth input/output terminal 7.

$$\Delta V = V1 - V2 \quad (1)$$

Further, as expressed in equation (2), a resistance value "R" of the terminator resistor 5 is obtained by dividing the potential difference "ΔV" by the test current "It".

$$R = \Delta V / It \quad (2)$$

In the normal operation mode for normal operations, as shown in FIG. 2, the control circuit 16 turns on the first switching circuit 8 and the second switching circuit 9 and turns off the third switching circuit 10 and the fourth switching circuit 11.

At this moment, the first and second input/output terminals 2 and 3 act as generally used I/Os. The third and fourth input/output terminals 6 and 7 act as input/output terminals for allowing the differential input receiver circuit 4 to receive a signal having been transmitted through the transmission line.

In this way, the four-terminal method can be applied to the terminator resistor 5 in the semiconductor integrated circuit 100. In the normal operation mode, the first and second input/output terminals 2 and 3 can be used as typical I/Os for I/O process. Thus the semiconductor integrated circuit 100 makes it possible to achieve an accurate measurement of the terminator resistor without increasing the number of terminals of the product.

As described above, according to the semiconductor integrated circuit of the present embodiment, it is possible to reduce the number of input/output terminals while measuring the resistance value of the terminator resistor with higher accuracy.

Second Embodiment

The first embodiment described the configuration having the differential input receiver circuit for receiving a signal having been transmitted through the transmission line.

The present embodiment will describe a configuration having a differential output driver circuit for outputting a signal to be propagated through a transmission line.

Figure 3:
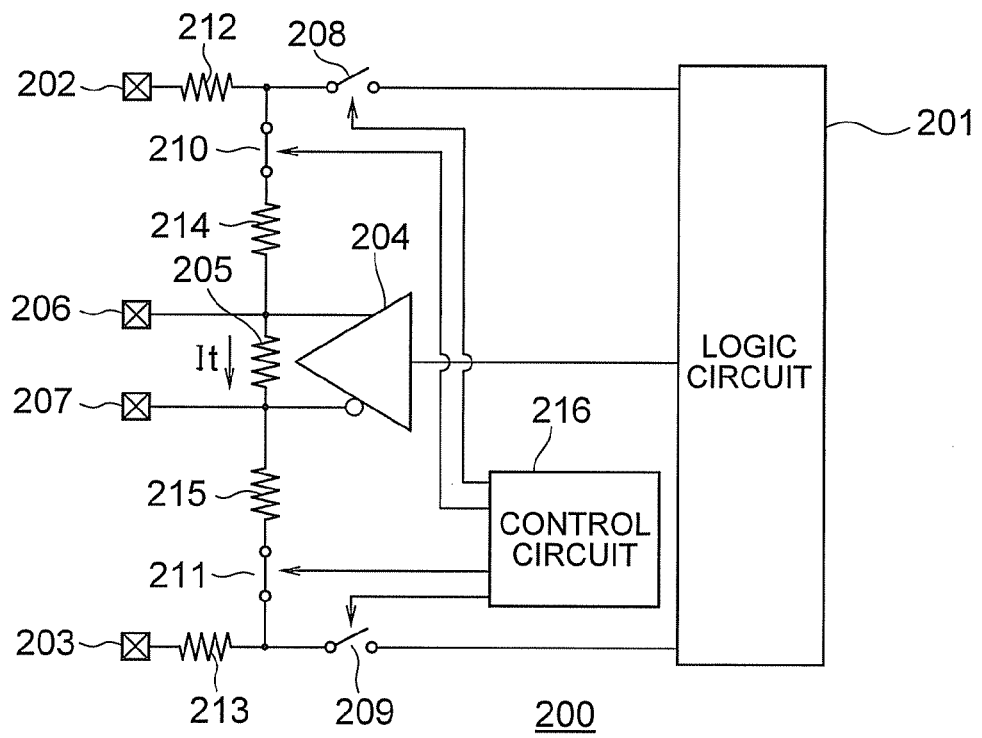
FIG. 3 shows the configuration of the main part of a semiconductor integrated circuit 200 according to a second embodiment.
Figure 4:
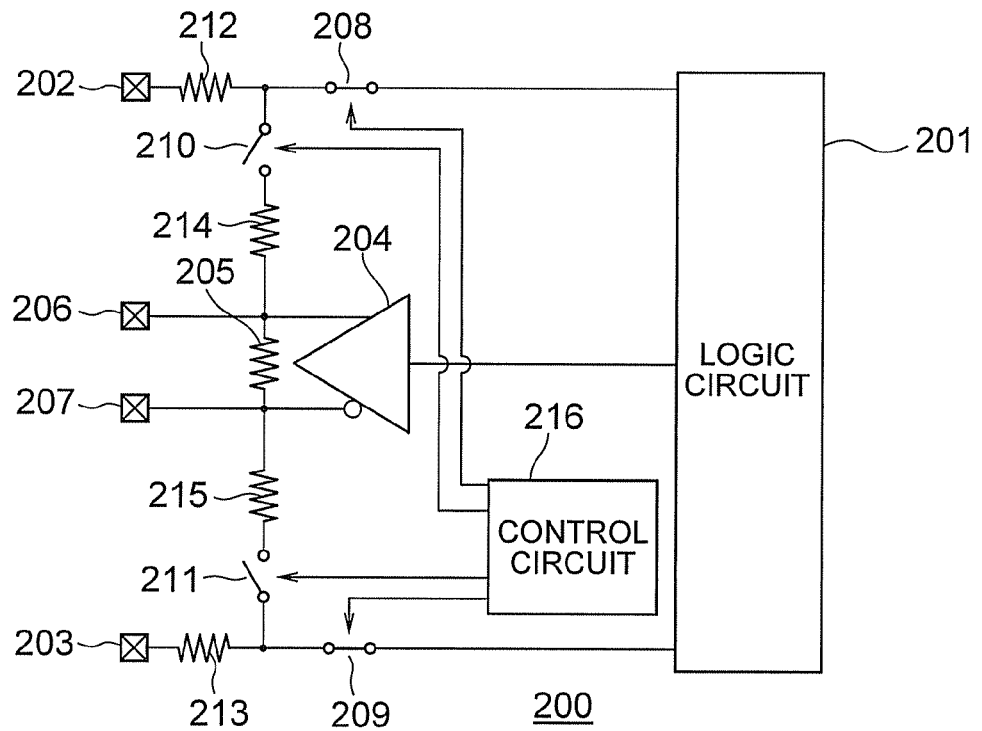
FIG. 4 shows the configuration of the main part of a semiconductor integrated circuit 200 according to the second embodiment.

FIGS. 3 and 4 show the configuration of the main part of a semiconductor integrated circuit 200 according to a second embodiment which is an aspect of the present invention. FIG. 3 shows the semiconductor integrated circuit 200 placed in a test operation mode which will be described later. FIG. 4 shows the semiconductor integrated circuit 200 placed in a normal operation mode which will be described later.

As shown in FIGS. 3 and 4, the semiconductor integrated circuit 200 for transmitting a signal to be propagated through the transmission line (not shown) includes a logic circuit 201 for performing logical operations, a first input/output terminal 202 connected to the logic circuit 201, and a second input/output terminal 203 connected to the logic circuit 201.

In the normal operation mode for normal operations, the first and second input/output terminals 202 and 203 are used to input desired signals to the logic circuit 201 from other circuits (not shown) and output signals from the logic circuit 201.

The semiconductor integrated circuit 200 further includes a differential output driver circuit 204 which has an input connected to the logic circuit 201 and outputs, to the transmission line, a signal having been outputted from the logic circuit 201, and a terminator resistor 205 connected between the non-inverting output terminal and the inverting output terminal of the differential output driver circuit 204 to achieve impedance matching with the transmission line.

The terminator resistor 205 has, as in the first embodiment, a resistance value defined by the predetermined specifications of the product. In the specifications, the resistance value is set at, e.g., 100 Ω±15 Ω.

The semiconductor integrated circuit 200 further includes a third input/output terminal 206 connected to the non-inverting input terminal of the differential output driver circuit 204 to transmit a signal to be propagate to the transmission line, and a fourth input/output terminal 207 connected to the inverting input terminal of the differential output driver circuit 204 to transmit a signal to be propagated through the transmission line.

The semiconductor integrated circuit 200 further includes a first switching circuit 208 connected between the logic circuit 201 and the first input/output terminal 202, a second switching circuit 209 connected between the logic circuit 201 and the second input/output terminal 203, a third switching circuit 210 connected between the first input/output terminal 202 and the third input/output terminal 206, and a fourth switching circuit 211 connected between the second input/output terminal 203 and the fourth input/output terminal 207.

Since a test current "It" passes through the third switching circuit 210 and the fourth switching circuit 211, it is desirable that the third switching circuit 210 and the fourth switching circuit 211 be analog switching circuits having low on resistances. In the present embodiment, as in the first embodiment, the first to fourth switching circuits 208, 209, 210 and 211 are each made up of a transistor such as a MOS transistor and a bipolar transistor which are controlled to be turned on/off in response to an input signal.

The semiconductor integrated circuit 200 further includes a first resistor 212 connected between the first switching circuit 208 and third switching circuit 210 and the first input/output terminal 202, a second resistor 213 connected between the second switching circuit 209 and fourth switching circuit 211 and the second input/output terminal 203, a third resistor 214 connected between the third switching circuit 210 and the third input/output terminal 206, and a fourth resistor 215 connected between the fourth switching circuit 211 and the fourth input/output terminal 207.

As described above, the first to fourth switching circuits 208, 209, 210 and 211 are each made up of a transistor. The first to fourth switching circuits 208, 209, 210 and 211 are, however, connected to the first to fourth input/output terminals 202, 203, 206 and 207 via the first to fourth resistors 212, 213, 214 and 215. Thus as in the first embodiment, it is possible to prevent electrostatic discharge (ESD) and the like of the transistors.

The semiconductor integrated circuit 200 further includes a control circuit 216 for controlling the on/off of the first to fourth switching circuits 208, 209, 210 and 211 by outputting signals.

The operations of the semiconductor integrated circuit 200 configured thus (a measuring method of the terminator resistor 205 in the semiconductor integrated circuit 200) will now be described.

In the test operation mode for measuring the resistance value of the terminator resistor 205, as shown in FIG. 3, the control circuit 216 turns off the first switching circuit 208 and the second switching circuit 209 and turns on the third switching circuit 210 and the fourth switching circuit 211.

At this moment, a path for passing the test current "It" through the terminator resistor 205 is formed between the first input/output terminal 202 and the second input/output terminal 203. Furthermore, a potential difference across the terminator resistor 205 can be measured using the third input/output terminal 206 and the fourth input/output terminal 207. Thus a four-terminal measurement can be performed on the terminator resistor 205 as in the first embodiment.

In other words, in the test operation mode, the test current "It" is passed between the first input/output terminal 202 and the second input/output terminal 203, so that the test current "It" is applied to the terminator resistor 205. Moreover, a potential difference "ΔV" between the third input/output terminal 206 and the fourth input/output terminal 207 is measured as expressed in equation (1) of the first embodiment.

Furthermore, as expressed in equation (2) of the first embodiment, a resistance value "R" of the terminator resistor 205 is obtained by dividing the potential difference ΔV by the test current "It".

In the normal operation mode for normal operations, as shown in FIG. 4, the control circuit 216 turns on the first switching circuit 208 and the second switching circuit 209 and turns off the third switching circuit 210 and the fourth switching circuit 211.

At this moment, the first and second input/output terminals 202 and 203 act as generally used I/Os as in the first embodiment. The third and fourth input/output terminals 206 and 207 act as input/output terminals for enabling the differential output driver circuit 204 to transmit a signal to be propagated through the transmission line.

In this way, in the semiconductor integrated circuit 200, the four-terminal method can be applied to the terminator resistor 205 as in the first embodiment. In the normal operation mode, the first and second input/output terminals 202 and 203 can be used as typical I/Os for I/O process. Thus the semiconductor integrated circuit 200 makes it possible to achieve an accurate measurement of the terminator resistor without increasing the number of terminals of the product, as in the first embodiment.

As described above, according to the semiconductor integrated circuit of the present embodiment, it is possible to reduce the number of input/output terminals while measuring the resistance value of the terminator resistor with higher accuracy.

Third Embodiment

Figure 5:
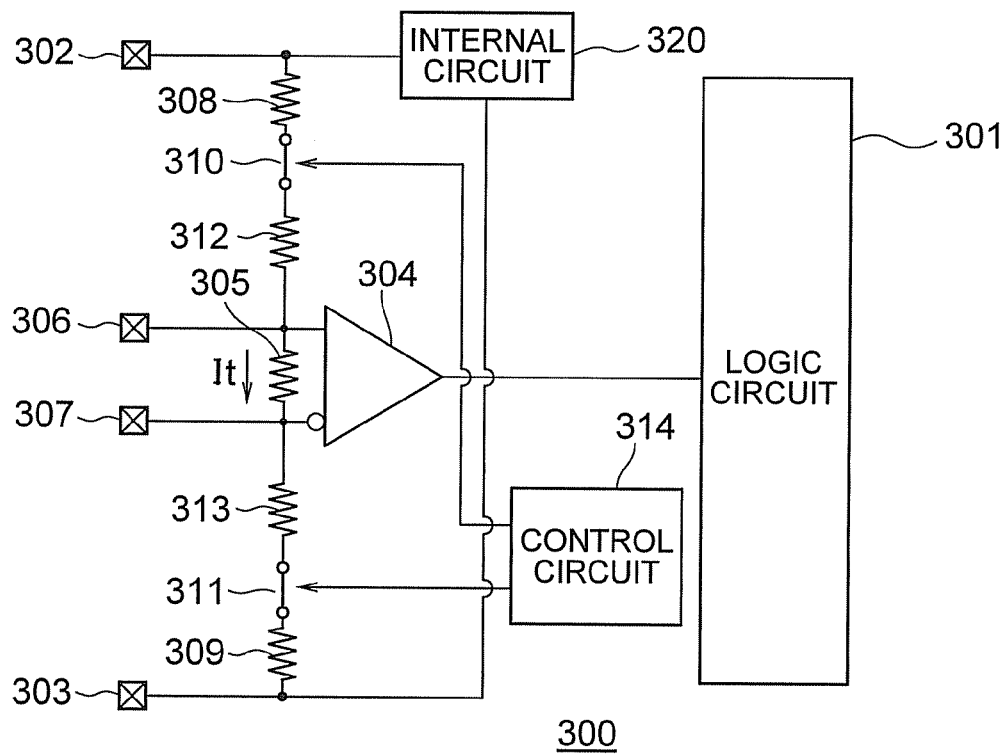
FIG. 5 shows the configuration of the main part of a semiconductor integrated circuit 300 according to a third embodiment.
Figure 6:
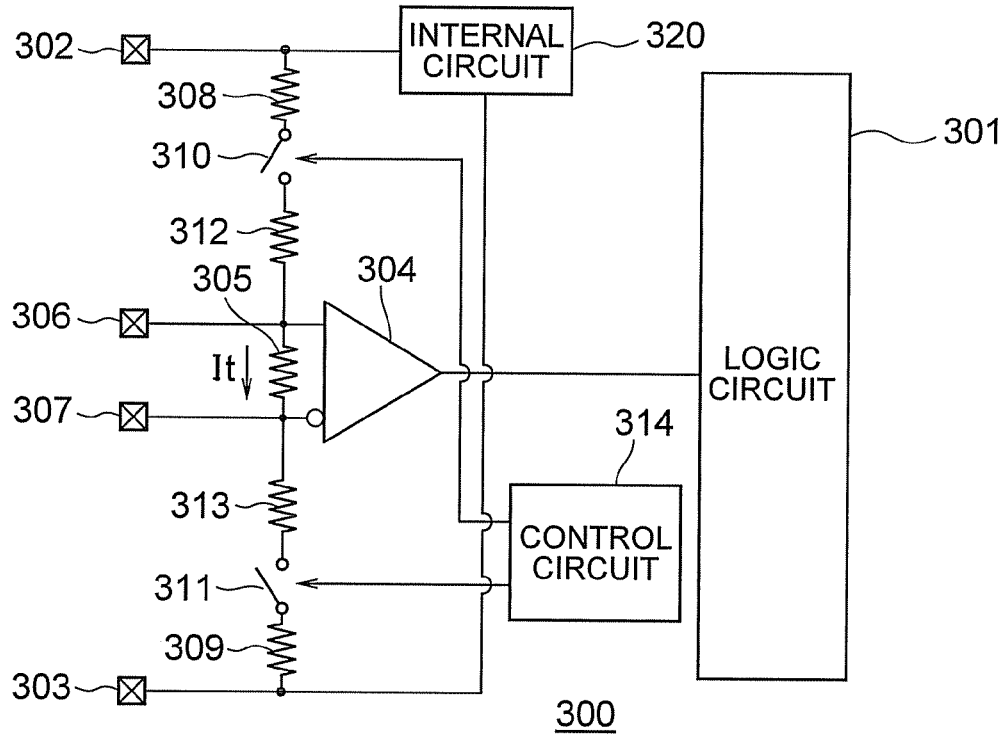
FIG. 6 shows the configuration of the main part of a semiconductor integrated circuit 300 according to the third embodiment.

FIGS. 5 and 6 show the configuration of the main part of a semiconductor integrated circuit 300 according to a third embodiment which is an aspect of the present invention. FIG. 5 shows the semiconductor integrated circuit 300 placed in a test operation mode which will be described later. FIG. 6 shows the semiconductor integrated circuit 300 placed in a normal operation mode which will be described later.

As shown in FIGS. 5 and 6, the semiconductor integrated circuit 300 for receiving a signal having been transmitted through a transmission line (not shown) includes a first input/output terminal 302 connected to a power supply or the ground, a second input/output terminal 303, and an internal circuit 320.

The first and second input/output terminals 302 and 303 are connected to the internal circuit 320. In the normal operation mode for normal operations, the first and second input/output terminals 302 and 303 are used to supply power or a ground potential to the internal circuit 320.

The semiconductor integrated circuit 300 further includes a differential input receiver circuit 304 which has an output connected to the logic circuit 301, receives a signal having been transmitted through the transmission line, and outputs the signal to the logic circuit 301, and a terminator resistor 305 connected between the non-inverting input terminal and the inverting input terminal of the differential input receiver circuit 304 to achieve impedance matching with the transmission line.

The terminator resistor 305 has, as in the first embodiment, a resistance value defined by the predetermined specifications of the product. In the specifications, the resistance value is set at, e.g., 100 Ω±15 Ω.

The semiconductor integrated circuit 300 further includes a third input/output terminal 306 connected to the non-inverting input terminal of the differential input receiver circuit 304 to receive a signal having been transmitted through the transmission line, and a fourth input/output terminal 307 connected to the inverting input terminal of the differential input receiver circuit 304 to receive a signal having been transmitted through the transmission line.

The semiconductor integrated circuit 300 further includes a first switching circuit 310 connected between the first input/output terminal 302 and the third input/output terminal 306, and a second switching circuit 311 connected between the second input/output terminal 303 and the fourth input/output terminal 307.

Since a test current "It" passes through the first switching circuit 310 and the second switching circuit 311, it is desirable that the first switching circuit 310 and the second switching circuit 311 be analog switching circuits having low on resistances. In the present embodiment, as in the first embodiment, the first and second switching circuits 310 and 311 are each made up of a transistor such as a MOS transistor and a bipolar transistor which are controlled to be turned on/off in response to an input signal.

The semiconductor integrated circuit 300 further includes a first resistor 308 connected between the first input/output terminal 302 and the first switching circuit 310, a second resistor 309 connected between the second input/output terminal 303 and the second switching circuit 311, a third resistor 312 connected between the first switching circuit 310 and the third input/output terminal 306, and a fourth resistor 313 connected between the second switching circuit 311 and the fourth input/output terminal 307.

As described above, the first and second switching circuits 310 and 311 are each made up of a transistor. The first and second switching circuits 310 and 311 are, however, connected to the first and second input/output terminals 302 and 303 via the first and second resistors 308 and 309. Thus as in the first embodiment, it is possible to prevent electrostatic discharge (ESD) and the like of the transistors.

The semiconductor integrated circuit 300 further includes a control circuit 314 for controlling the on/off of the first and second switching circuits 310 and 311 by outputting signals.

The operations of the semiconductor integrated circuit 300 configured thus (a measuring method of the terminator resistor 305 in the semiconductor integrated circuit 300) will now be described.

In the test operation mode for measuring the resistance value of the terminator resistor 305, as shown in FIG. 5, the control circuit 314 turns on the first switching circuit 310 and the second switching circuit 311.

At this moment, a path for passing the test current through the terminator resistor 305 is formed between the first input/output terminal 302 and the second input/output terminal 303. Furthermore, a potential difference across the terminator resistor 305 can be measured using the third input/output terminal 306 and the fourth input/output terminal 307. Thus a four-terminal measurement can be performed on the terminator resistor 305 as in the first embodiment.

In other words, in the test operation mode, the test current "It" is passed between the first input/output terminal 302 and the second input/output terminal 303, so that the test current "It" is applied to the terminator resistor 305. Moreover, a potential difference ΔV between the third input/output terminal 306 and the fourth input/output terminal 307 is measured as expressed in equation (1) of the first embodiment.

Furthermore, as expressed in equation (2) of the first embodiment, a resistance value "R" of the terminator resistor 305 is obtained by dividing the potential difference ΔV by the test current "It".

In the normal operation mode for normal operations, as shown in FIG. 6, the control circuit 314 turns off the first switching circuit 310 and the second switching circuit 311.

At this moment, the first and second input/output terminals 302 and 303 act as input/output terminals for supplying power or a ground potential. The third and fourth input/output terminals 306 and 307 act as input/output terminals for enabling the differential input receiver circuit 304 to receive a signal having been transmitted through the transmission line.

Fourth Embodiment

Figure 7:
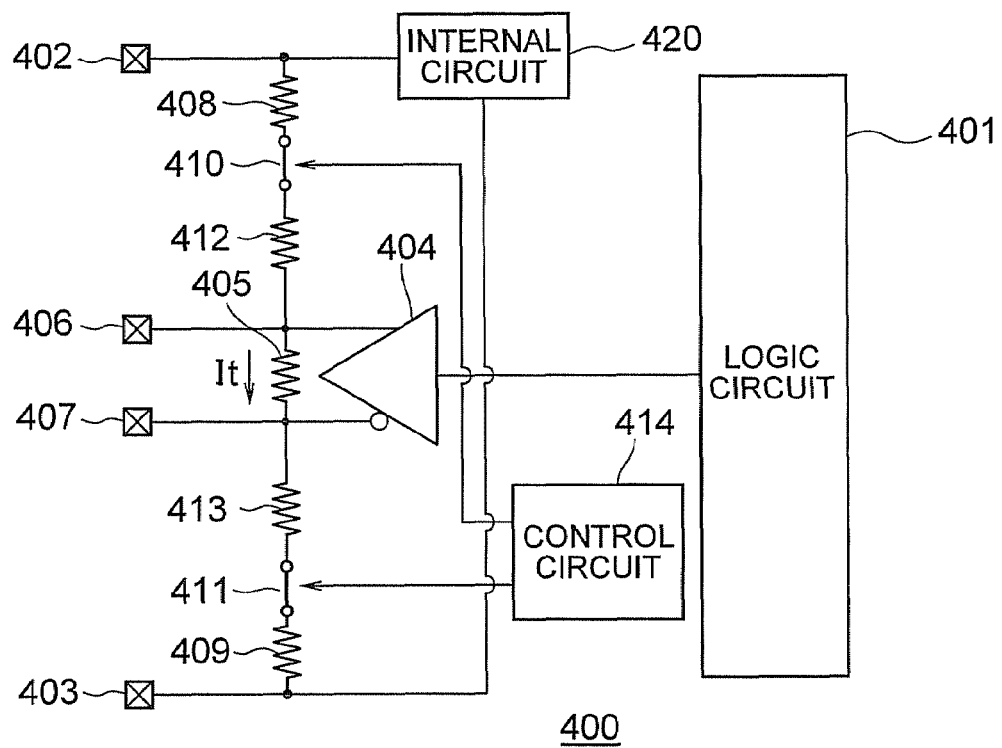
FIG. 7 shows the configuration of the main part of a semiconductor integrated circuit 400 according to a fourth embodiment.
Figure 8:
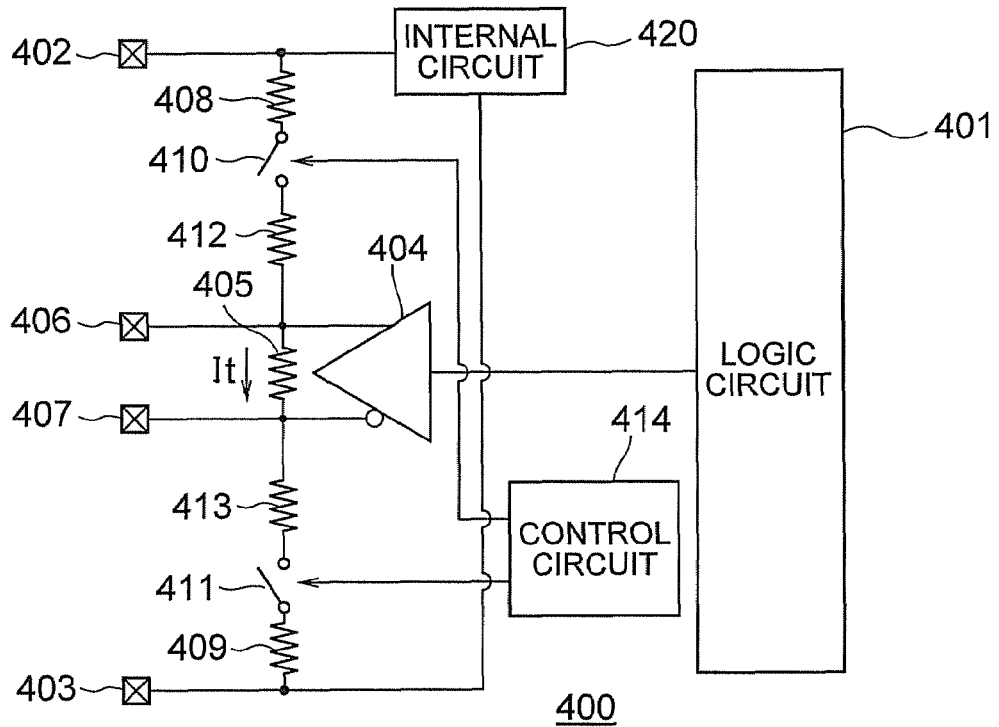
FIG. 8 shows the configuration of the main part of a semiconductor integrated circuit 400 according to the fourth embodiment.

FIGS. 7 and 8 show the configuration of the main part of a semiconductor integrated circuit 400 according to a fourth embodiment which is an aspect of the present invention. FIG. 7 shows the semiconductor integrated circuit 400 placed in a test operation mode which will be described later. FIG. 8 shows the semiconductor integrated circuit 400 placed in a normal operation mode which will be described later.

As shown in FIGS. 7 and 8, the semiconductor integrated circuit 400 for transmitting a signal to be propagated through a transmission line (not shown) includes a first input/output terminal 402 connected to a power supply or the ground, a second input/output terminal 403, and an internal circuit 420.

The first and second input/output terminals 402 and 403 are connected to the internal circuit 420 and are used to supply power or a ground potential to the internal circuit 420 in the normal operation mode for normal operations.

The semiconductor integrated circuit 400 further includes a differential output driver circuit 404 which has an input connected to a logic circuit 401 and outputs, to the transmission line, a signal having been outputted from the logic circuit 401, and a terminator resistor 405 connected between the non-inverting output terminal and the inverting output terminal of the differential output driver circuit 404 to achieve impedance matching with the transmission line.

The terminator resistor 405 has, as in the first embodiment, a resistance value defined by the predetermined specifications of the product. In the specifications, the resistance value is set at, e.g., 100 Ω±15 Ω.

The semiconductor integrated circuit 400 further includes a third input/output terminal 406 connected to the non-inverting input terminal of the differential output driver circuit 404 to transmit a signal to be propagated through the transmission line, and a fourth input/output terminal 407 connected to the inverting input terminal of the differential output driver circuit 404 to transmit a signal to be propagated through the transmission line.

The semiconductor integrated circuit 400 further includes a first switching circuit 410 connected between the first input/output terminal 402 and the third input/output terminal 406, and a second switching circuit 411 connected between the second input/output terminal 403 and the fourth input/output terminal 407.

Since a test current "It" passes through the first switching circuit 410 and the second switching circuit 411, it is desirable that the first switching circuit 410 and the second switching circuit 411 be analog switching circuits having low on resistances. In the present embodiment, as in the first embodiment, the first and second switching circuits 410 and 411 are each made up of a transistor such as a MOS transistor and a bipolar transistor which are controlled to be turned on/off in response to an input signal.

The semiconductor integrated circuit 400 further includes a first resistor 408 connected between the first input/output terminal 402 and the first switching circuit 410, a second resistor 409 connected between the second input/output terminal 403 and the second switching circuit 411, a third resistor 412 connected between the first switching circuit 410 and the third input/output terminal 406, and a fourth resistor 413 connected between the second switching circuit 411 and the fourth input/output terminal 407.

As described above, the first and second switching circuits 410 and 411 are each made up of a transistor. The first and second switching circuits 410 and 411 are, however, connected to the first and second input/output terminals 402 and 403 via the first and second resistors 408 and 409. Thus as in the first embodiment, it is possible to prevent electrostatic discharge (ESD) and the like of the transistors.

The semiconductor integrated circuit 400 further includes a control circuit 414 for controlling the on/off of the first and second switching circuits 410 and 411 by outputting signals.

The operations of the semiconductor integrated circuit 400 configured thus (a measuring method of the terminator resistor 405 in the semiconductor integrated circuit 400) will now be described.

In the test operation mode for measuring the resistance value of the terminator resistor 405, as shown in FIG. 7, the control circuit 414 turns on the first switching circuit 410 and the second switching circuit 411.

At this moment, a path for passing the test current through the terminator resistor 405 is formed between the first input/output terminal 402 and the second input/output terminal 403. Furthermore, a potential difference across the terminator resistor 405 can be measured using the third input/output terminal 406 and the fourth input/output terminal 407. Thus a four-terminal measurement can be performed on the terminator resistor 405 as in the first embodiment.

In other words, in the test operation mode, the test current "It" is passed between the first input/output terminal 402 and the second input/output terminal 403, so that the test current "It" is applied to the terminator resistor 405. Moreover, a potential difference ΔV between the third input/output terminal 406 and the fourth input/output terminal 407 is measured as expressed in equation (1) of the first embodiment.

Furthermore, as expressed in equation (2) of the first embodiment, a resistance value "R" of the terminator resistor 405 is obtained by dividing the potential difference ΔV by the test current "It".

In the normal operation mode for normal operations, as shown in FIG. 8, the control circuit 414 turns off the first switching circuit 410 and the second switching circuit 411.

At this moment, the first and second input/output terminals 402 and 403 act as input/output terminals for supplying power or a ground potential. The third and fourth input/output terminals 406 and 407 act as input/output terminals for enabling the differential output driver circuit 404 to transmit a signal to be propagated through the transmission line.

In this way, in the semiconductor integrated circuit 400, the four-terminal method can be applied to the terminator resistor 405 as in the first embodiment. In the normal operation mode, the first and second input/output terminals 402 and 403 can be used as power supply terminals or ground terminals. Thus the semiconductor integrated circuit 400 makes it possible to achieve an accurate measurement of the terminator resistor without increasing the number of terminals of the product, as in the first embodiment.

What is claimed is:

1. A semiconductor integrated circuit for receiving a signal having been propagated through a transmission line, comprising:

a logic circuit that performs a logical operation;

a first input/output terminal connected to the logic circuit;

a second input/output terminal connected to the logic circuit;

a differential input receiver circuit having an output connected to the logic circuit, receiving the signal having been propagated through the transmission line, and outputting the signal to the logic circuit;

a terminator resistor connected between a non-inverting input terminal and an inverting input terminal of the differential input receiver circuit to achieve impedance matching with the transmission line;

a third input/output terminal connected to the non-inverting input terminal of the differential input receiver circuit to receive the signal;

a fourth input/output terminal connected to the inverting input terminal of the differential input receiver circuit to receive the signal;

a first switching circuit connected between the logic circuit and the first input/output terminal;

a second switching circuit connected between the logic circuit and the second input/output terminal;

a third switching circuit connected between the first input/output terminal and the third input/output terminal;

a fourth switching circuit connected between the second input/output terminal and the fourth input/output terminal; and a control circuit that controls on/off of the first to fourth switching circuits, wherein the control circuit turns off the first switching circuit and the second switching circuit and turns on the third switching circuit and the fourth switching circuit in a test operation mode for measuring a resistance value of the terminator resistor, and the control circuit turns on the first switching circuit and the second switching circuit and turns off the third switching circuit and the fourth switching circuit in a normal operation mode for a normal operation.

2. The semiconductor integrated circuit according to claim 1, further comprising a first resistor connected between the first and third switching circuits and the first input/output terminal;

a second resistor connected between the second and fourth switching circuits and the second input/output terminal;

a third resistor connected between the third switching circuit and the third input/output terminal; and a fourth resistor connected between the fourth switching circuit and the fourth input/output terminal, wherein the first to fourth switching circuits are each made up of a transistor controlled to be turned on/off in response to an input signal from the control circuit.

3. A semiconductor integrated circuit for transmitting a signal to be propagated through a transmission line, comprising:

a logic circuit that performs a logical operation;

a first input/output terminal connected to the logic circuit;

a second input/output terminal connected to the logic circuit;

a differential output driver circuit having an input connected to the logic circuit, and transmitting, to the transmission line, a signal having been outputted from the logic circuit;

a terminator resistor connected between a non-inverting output terminal and an inverting output terminal of the differential output driver circuit to achieve impedance matching with the transmission line;

a third input/output terminal connected to the non-inverting output terminal of the differential output driver circuit to transmit the signal;

a fourth input/output terminal connected to the inverting output terminal of the differential output driver circuit to transmit the signal;

a first switching circuit connected between the logic circuit and the first input/output terminal;

a second switching circuit connected between the logic circuit and the second input/output terminal;

a third switching circuit connected between the first input/output terminal and the third input/output terminal;

a fourth switching circuit connected between the second input/output terminal and the fourth input/output terminal; and a control circuit that controls on/off of the first to fourth switching circuits, wherein the control circuit turns off the first switching circuit and the second switching circuit and turns on the third switching circuit and the fourth switching circuit in a test operation mode for measuring a resistance value of the terminator resistor, and the control circuit turns on the first switching circuit and the second switching circuit and turns off the third switching circuit and the fourth switching circuit in a normal operation mode for a normal operation.

4. The semiconductor integrated circuit according to claim 3, further comprising a first resistor connected between the first and third switching circuits and the first input/output terminal;

a second resistor connected between the second and fourth switching circuits and the second input/output terminal;

a third resistor connected between the third switching circuit and the third input/output terminal; and a fourth resistor connected between the fourth switching circuit and the fourth input/output terminal, wherein the first to fourth switching circuits are each made up of a transistor controlled to be turned on/off in response to an input signal from the control circuit.

5. A semiconductor integrated circuit for receiving a signal having been propagated through a transmission line, comprising:

a first input/output terminal connected to a first potential;

a second input/output terminal connected to a second potential;

a logic circuit that performs a logical operation;

a differential input receiver circuit having an output connected to the logic circuit, receiving the signal having been propagated through the transmission line, and outputting the signal to the logic circuit;

a terminator resistor connected between a non-inverting input terminal and an inverting input terminal of the differential input receiver circuit to achieve impedance matching with the transmission line;

a third input/output terminal connected to the non-inverting input terminal of the differential input receiver circuit to receive the signal;

a fourth input/output terminal connected to the inverting input terminal of the differential input receiver circuit to receive the signal;

a first switching circuit connected between the first input/output terminal and the third input/output terminal;

a second switching circuit connected between the second input/output terminal and the fourth input/output terminal; and a control circuit that controls on/off of the first and second switching circuits, wherein the control circuit turns on the first switching circuit and the second switching circuit in a test operation mode for measuring a resistance value of the terminator resistor, and the control circuit turns off the first switching circuit and the second switching circuit in a normal operation mode for a normal operation.

6. The semiconductor integrated circuit according to claim 5, wherein the first potential is one of a power supply potential and a ground potential, and the second potential is one of the power supply potential and the ground potential.

7. The semiconductor integrated circuit according to claim 6, further comprising an internal circuit fed with one of the power supply potential and the ground potential, wherein the first input/output terminal and the second input/output terminal are connected to the internal circuit.

8. A semiconductor integrated circuit for transmitting a signal to be propagated through a transmission line, comprising:

a logic circuit that performs a logical operation;

a first input/output terminal connected to a first potential;

a second input/output terminal connected to a second potential;

a differential output driver circuit having an input connected to the logic circuit, and transmitting, to the transmission line, a signal having been outputted from the logic circuit;

a terminator resistor connected between a non-inverting output terminal and an inverting output terminal of the differential output driver circuit to achieve impedance matching with the transmission line;

a third input/output terminal connected to the non-inverting output terminal of the differential output driver circuit to transmit the signal;

a fourth input/output terminal connected to the inverting output terminal of the differential output driver circuit to transmit the signal;

a first switching circuit connected between the first input/output terminal and the third input/output terminal;

a second switching circuit connected between the second input/output terminal and the fourth input/output terminal; and a control circuit that controls on/off of the first and second switching circuits, wherein the control circuit turns on the first switching circuit and the second switching circuit in a test operation mode for measuring a resistance value of the terminator resistor, and the control circuit turns off the first switching circuit and the second switching circuit in a normal operation mode for a normal operation.

9. The semiconductor integrated circuit according to claim 8, wherein the first potential is one of a power supply potential and a ground potential, and the second potential is one of the power supply potential and the ground potential.

10. The semiconductor integrated circuit according to claim 9, further comprising an internal circuit fed with one of the power supply potential and the ground potential, wherein the first input/output terminal and the second input/output terminal are connected to the internal circuit.

* * * * *